(12) United States Patent
Misic et al.

(10) Patent No.: US 8,581,590 B2
(45) Date of Patent: Nov. 12, 2013

(54) QUADRATURE ENDORECTAL COILS AND INTERFACE DEVICES THEREFOR

(75) Inventors: George J. Misic, Allison Park, PA (US); Robert J. McKenney, Indianola, PA (US)

(73) Assignee: MEDRAD, Inc., Indianola, PA (US)

( * ) Notice: Subject to any disclaimer, the term of this patent is extended or adjusted under 35 U.S.C. 154(b) by 335 days.

(21) Appl. No.: 13/128,361

(22) PCT Filed: Nov. 12, 2009

(86) PCT No.: PCT/US2009/064266
§ 371 (c)(1),
(2), (4) Date: May 9, 2011

(87) PCT Pub. No.: WO2010/056911
PCT Pub. Date: May 20, 2010

(65) Prior Publication Data
US 2011/0215807 A1    Sep. 8, 2011

Related U.S. Application Data

(60) Provisional application No. 61/114,029, filed on Nov. 12, 2008.

(51) Int. Cl.
*G01V 3/00* (2006.01)
(52) U.S. Cl.
USPC .......................................... 324/322; 324/318
(58) Field of Classification Search
USPC ............................ 324/300–322; 600/407–445
See application file for complete search history.

(56) References Cited

U.S. PATENT DOCUMENTS

| 4,816,765 A | 3/1989 | Boskamp |
| 5,050,607 A | 9/1991 | Bradley et al. |

(Continued)

FOREIGN PATENT DOCUMENTS

| EP | 0385367 A1 | 9/1990 |
| WO | 03098236 A2 | 11/2003 |

(Continued)

OTHER PUBLICATIONS

Counterpart International application No. PCT/US2009/064266 International Search Report and the Written Opinion of the International Searching Authority.

(Continued)

*Primary Examiner* — Brij Shrivastav
(74) *Attorney, Agent, or Firm* — James R. Stevenson

(57) ABSTRACT

An intracavity probe for use with an MR system allows images and spectra of internal anatomical structures to be obtained. The intracavity probe houses within its balloon-type enclosure a single-element quadrature coil sensitive to both the vertical and horizontal components of the MR signal. The quadrature coil by means of its output line is designed to plug into a dedicated interface device with which to interface the quadrature coil with the MR system. Drive capacitors within the coil in conjunction with the electrical length of the output line and phase shifting networks within the interface device enable complete decoupling of the quadrature coil from the transmit fields generated by the MR system. Preamplifier, power splitting and combining networks within the interface device process voltage signals representative of the horizontal and vertical components of the MR signal and enable them to be conveyed to the input port(s) of the MR system.

10 Claims, 12 Drawing Sheets

(56) References Cited

U.S. PATENT DOCUMENTS

| | | | |
|---|---|---|---|
| 5,057,778 A | 10/1991 | Rath | |
| 5,307,814 A | 5/1994 | Kressel et al. | |
| 5,348,010 A | 9/1994 | Schnall et al. | |
| 5,355,087 A | 10/1994 | Claiborne et al. | |
| 5,451,232 A | 9/1995 | Rhinehart et al. | |
| 5,476,095 A | 12/1995 | Schnall et al. | |
| 5,578,925 A * | 11/1996 | Molyneaux et al. | 324/318 |
| 5,635,928 A | 6/1997 | Takagi et al. | |
| 5,757,189 A * | 5/1998 | Molyneaux et al. | 324/318 |
| 6,294,972 B1 | 9/2001 | Jesmanowicz et al. | |
| 6,307,371 B1 | 10/2001 | Zeiger | |
| 6,747,452 B1 | 6/2004 | Jectic et al. | |
| 6,798,206 B2 | 9/2004 | Misic | |
| 6,831,460 B2 | 12/2004 | Reisker et al. | |
| 6,914,432 B2 | 7/2005 | Dumoulin et al. | |
| 7,012,430 B2 | 3/2006 | Misic | |
| 7,084,629 B2 | 8/2006 | Monski, Jr. et al. | |
| 7,141,971 B2 | 11/2006 | Duensing et al. | |
| 7,382,132 B1 | 6/2008 | Mathew et al. | |
| 7,446,528 B2 | 11/2008 | Doddrell et al. | |
| 7,692,427 B2 | 4/2010 | Lee et al. | |
| 7,911,209 B2 | 3/2011 | Alradady et al. | |
| 2003/0023609 A1 | 1/2003 | Della-Libera et al. | |
| 2003/0158475 A1 | 8/2003 | Johnson et al. | |
| 2004/0236209 A1 | 11/2004 | Misic et al. | |
| 2009/0076378 A1 | 3/2009 | Misic | |
| 2011/0121833 A1* | 5/2011 | Sambandamurthy et al. | 324/318 |
| 2011/0215807 A1* | 9/2011 | Misic et al. | 324/322 |
| 2012/0112748 A1* | 5/2012 | Hetherington et al. | 324/318 |

FOREIGN PATENT DOCUMENTS

| | | |
|---|---|---|
| WO | 2006017344 A1 | 2/2006 |
| WO | 2008104895 A1 | 9/2008 |
| WO | 2010056911 A1 | 5/2010 |

OTHER PUBLICATIONS

Gilderdale, D.J., et al., "Design and use of internal receiver coils for magnetic resonance imaging," The British Journal of Radiology, vol. 72, pp. 1141-1151, The British Institute of Radiology (1999).

* cited by examiner

Loop

Vertical Field

Butterfly Coil

Horizontal Field

QUADRATURE ENDORECTAL COILS AND INTERFACE DEVICES THEREFOR

FIELD OF THE INVENTION

The present invention generally relates to systems and methods of obtaining images and spectra of intracavity structures using magnetic resonance (MR) systems. More particularly, the present invention pertains to a quadrature endorectal coil and an associated interface device capable of providing images and spectroscopic results from the MR signals obtained from the nuclei excited during MR procedures.

BRIEF DESCRIPTION OF RELATED ART

The following background information is provided to assist the reader to understand the invention disclosed below and the environment in which it will typically be used. The terms used herein are not intended to be limited to any particular narrow interpretation unless clearly stated otherwise, either expressly or impliedly, in this document.

Magnetic resonance imaging (MRI) is a noninvasive method of producing high quality images of the interior of the human body. It allows medical personnel to see inside the human body without surgery or the use of ionizing radiation such as X-rays. The images are of such high resolution that cancer and other forms of pathology can often be visually distinguished from healthy tissue. Magnetic resonance techniques and systems have also been developed for performing spectroscopic analyses by which the chemical content of body tissue or other material can be ascertained.

MRI uses a powerful magnet, radio waves and computer technology to create detailed images of the soft tissues, muscles, nerves and bones in the body. It does so by taking advantage of a basic property of the hydrogen atom, an atom found in abundance in all cells within living organisms. In the absence of a magnetic field, the nuclei of hydrogen atoms spin like a top, or precess, randomly in every direction. When subject to a strong magnetic field, however, the spin-axes of the hydrogen nuclei align themselves in the direction of the field. This is because the nucleus of the hydrogen atom has what is referred to as a large magnetic moment, a strong inherent tendency to line up with the direction of the field. Collectively, the hydrogen nuclei of the area to be imaged create an average vector of magnetization that points parallel to the magnetic field.

A typical MRI system, or scanner, includes a main magnet, three gradient coils, a radio frequency (RF) antenna (often referred to as the whole body coil), and a computer station from which an operator can control the system. The chief component of the MRI system, however, is the main magnet. It is typically superconducting in nature and cylindrical in shape. Within its bore (an opening into which patients are placed during an MRI procedure), the main magnet generates a strong magnetic field, often referred to as the $B_0$ field, which is both uniform and static (non-varying). This $B_0$ magnetic field is oriented along the longitudinal axis of the bore, referred to as the z direction, which compels the magnetization vectors of the hydrogen nuclei in the body to align themselves parallel to that axis. In this alignment, the nuclei are prepared to receive RF energy of the appropriate frequency from the whole body coil. This frequency is known as the Larmor frequency and is governed by the equation $\omega = \upsilon B_0$, where $\omega$ is the Larmor frequency (at which the hydrogen atoms precess), $\upsilon$ is the gyromagnetic constant, and $B_0$ is the strength of the static magnetic field.

The RF antenna, or whole body coil, is generally used both to transmit pulses of RF energy and to receive the resulting magnetic resonance (MR) signals induced thereby in the hydrogen nuclei. Specifically, during its transmit cycle, the body coil broadcasts RF energy into the cylindrical bore. This RF energy creates a radio frequency magnetic field, also known as the RF $B_1$ field, whose magnetic field lines are directed in a line perpendicular to the magnetization vector of the hydrogen nuclei. The RF pulse causes the spin-axes of the hydrogen nuclei to tilt with respect to the main ($B_0$) magnetic field, thus causing the net magnetization vector to deviate from the z direction by a known angle. The RF pulse, however, will affect only those hydrogen nuclei that are precessing about their axes at the frequency of the RF pulse. In other words, only the nuclei that "resonate" at that frequency will be affected, and such resonance is achieved in conjunction with the operation of the three gradient coils.

The gradient coils are electromagnetic coils. Each gradient coil is used to generate a linearly varying yet static magnetic field along one of the three spatial directions (x,y,z) within the bore. Positioned inside the main magnet, the gradient coils are able to alter the main magnetic field on a very local level when they are turned on and off very rapidly in a specific manner. Thus, in conjunction with the main magnet, the gradient coils can be operated according to various imaging techniques so that the hydrogen nuclei—at any given point or in any given strip, slice or unit of volume—will be able to achieve resonance when an RF pulse of the appropriate frequency is applied. In response to the RF pulse, the precessing hydrogen atoms in the selected region absorb the RF energy being transmitted from the body coil, thus forcing the magnetization vectors thereof to tilt away from the direction of the main ($B_0$) magnetic field. When the body coil is turned off, the hydrogen nuclei begin to release the RF energy in the form of the MR signal, as explained further below.

One well known technique that can be used to obtain images is referred to as the spin echo imaging technique. Operating according to this technique, the MRI system first activates one gradient coil to set up a magnetic field gradient along the z-axis. This is called the "slice select gradient," and it is set up when the RF pulse is applied and it shuts off when the RF pulse is turned off. It allows resonance to occur only within those hydrogen nuclei located within a slice of the area being imaged. No resonance will occur in any tissue located on either side of the plane of interest. Immediately after the RF pulse ceases, all of the nuclei in the activated slice are "in phase," i.e., their magnetization vectors all point in the same direction. Left to their own devices, the net magnetization vectors of all the hydrogen nuclei in the slice would relax, thus realigning with the z direction. Instead, however, the second gradient coil is briefly activated to create a magnetic field gradient along the y-axis. This is called the "phase encoding gradient." It causes the magnetization vectors of the nuclei within the slice to point, as one moves between the weakest and strongest ends of the gradient, in increasingly different directions. Next, after the RF pulse, slice select gradient and phase encoding gradient have been turned off, the third gradient coil is briefly activated to create a gradient along the x-axis. This is called the "frequency encoding gradient" or "read out gradient," as it is only applied when the MR signal is ultimately measured. It causes the relaxing magnetization vectors to be differentially re-excited, so that the nuclei near the low end of the gradient begin to precess at a faster rate, and those at the high end pick up even more speed. When these nuclei relax again, the fastest ones (those which were at the high end of the gradient) will emit the highest frequency of radio waves.

Collectively, the gradient coils allow the MR signal to be spatially encoded, so that each portion of the area being imaged is uniquely defined by the frequency and phase of its resonance signal. In particular, as the hydrogen nuclei relax, each becomes a miniature radio transmitter, giving out a characteristic pulse that changes over time, depending on the local microenvironment in which it resides. For example, hydrogen nuclei in fats have a different microenvironment than do those in water, and thus transmit different pulses. Due to these differences, in conjunction with the different water-to-fat ratios of dissimilar tissues, different tissues transmit radio signals of different frequencies. During its receive cycle, the body coil detects these miniature radio transmissions, which are often collectively referred to as the MR signal. From the body coil, these unique resonance signals are conveyed to the receivers of the MR system where they are converted into mathematical data corresponding thereto. The entire procedure must be repeated multiple times to form an image with a good signal-to-noise ratio (SNR). Using multi-dimensional Fourier transformations, an MR system can convert the mathematical data into a two- or even a three-dimensional image.

When more detailed images of a specific part of the body are needed, a local coil is often used instead of the whole body coil. A local coil can take the form of a volume coil or a surface coil. A volume coil is used to surround or enclose the volume to be imaged (e.g., a head, an arm, a wrist, a leg, or a knee). A surface coil, however, is merely placed upon the surface of a patient so that the underlying region of interest (e.g., the abdominal, thoracic and/or pelvic regions) can be imaged. In addition, a local coil can be designed to operate either as a receive-only coil or a transmit/receive (T/R) coil. The former is only capable of detecting the MR signals produced by the body in response to an MRI procedure, as noted above. A T/R coil, however, is capable of both receiving the MR signals as well as transmitting the RF pulses that produce the RF $B_1$ magnetic field, which is the prerequisite for inducing resonance in body tissue.

As for receive-only coils, it is well known in the field of MRI to use a single local coil, whether surface or volume, to detect the MR signals. Early receive coils were just linear coils, meaning that they could detect only one of the two quadrature (i.e., vertical $M_X$ and horizontal $M_Y$) components of the MR signals produced by the region of interest. One example of a linear coil is the single loop coil shown in FIG. 1. This loop is only capable of detecting magnetic fields (i.e., MR signals) that are oriented perpendicular/vertical to the plane of the loop. Another example of a linear coil is the butterfly coil shown in FIG. 2. Unlike the single loop, the butterfly coil is only sensitive to magnetic fields that are oriented parallel to the plane of the coil. This is because a butterfly coil is constructed by twisting a loop in the middle to form two identical subloops about a midpoint. Because the currents flowing in the subloops are the same but flow in counter-rotating directions, the magnetic flux generated by the current flowing through one subloop of the symmetric structure is equal but opposite to the flux due to the current in the other subloop. Therefore, about the midpoint of the structure, the vertical fields due to the counter-rotating currents oppose and thus cancel each other. The horizontal fields generated by those currents, however, combine, yielding a magnetic field that is oriented parallel to the plane of the coil.

Although they function as linear coils when used separately, the single loop and butterfly coil elements—when stacked one atop another—collectively function as a quadrature coil. When two such local coils are stacked and electronically combined to form a two-coil element structure, the resulting quadrature coil is rendered capable of detecting both the vertical and horizontal components of the MR signals emanating from the patient. As taught in U.S. Pat. No. 4,816,765, it is well known in the field of MRI to physically stack two linear coil elements to form such a quadrature coil.

Compared to linear receive coils, quadrature receive coils enable MRI systems to provide images of significantly higher SNR, typically as much as 41% greater than linear coils. Even with the improvement brought with quadrature mode detection, however, the single coil approach still invites improvement in terms of image quality. The disadvantage inherent to the single coil approach is attributable to just one coil structure being used to acquire the MR signals over the entire region of interest.

Phased array coil systems were developed to overcome the shortcomings with the single coil approach. Instead of one large local coil, the phased array approach uses a plurality of smaller local coils, with each such coil element covering or enclosing only a portion of the region of interest. In a system having two such coil elements, for example, each would cover or enclose approximately half of the region of interest, with the two coil elements typically being partially overlapped for purposes of magnetic isolation. The two coil elements would acquire the MR signals from their respective portions simultaneously, and they would not interact adversely due to the overlap. Because each element covers only half of the region of interest, each such element is able to receive MR signals at a higher SNR for that portion of the region within its coverage area. The smaller local coil elements of the phased array thus collectively provide the MRI system with the signal data necessary to generate an image of the entire region of interest that is higher in resolution than what can be obtained from a single large local coil alone.

One example of a phased array coil system is the Torso Array offered by MEDRAD, Inc. of Indianola, Pa. The torso array contains four surface coils, two of which disposed in an anterior paddle and the other two disposed in a posterior paddle. The two paddles are designed to be placed against the anterior and posterior surfaces, respectively, of a patient about the abdominal, thoracic and pelvic regions. The torso array is designed for use with an MR system whose data acquisition system has multiple receivers. The four leads of the torso array, one each from the two anterior surface coils and the two posterior surface coils, can be connected to separate receivers, with each receiver amplifying and digitizing the signal it receives. The MR system then combines the digitized data from the separate receivers to form an image whose overall SNR is better than what could be obtained from a single local coil, or even two larger anterior and posterior local coils, covering the entire region of interest alone.

It is also well known to use intracavity probes to obtain images of internal body structures. Several prior art intracavity probes are disclosed in U.S. Pat. Nos. 5,476,095 and 5,355,087 and U.S. application Ser. Nos. 10/483,945 and 11/719,253 (published as U.S. Patent Application Publications 2004/0236209A1 and 2009/0076378A1, respectively), all of which are assigned to the assignee of the present invention and incorporated herein by reference. The prior art probes disclosed in these references are designed to be inserted into body openings such as the rectum, vagina, and mouth. Those references also disclose interface devices that are designed to interface their respective intracavity probes with MR imaging and spectroscopy systems. A method of using an intracavity probe is disclosed in U.S. Pat. No. 5,348,010, which is also assigned to the assignee of the present invention and incorporated herein by reference.

Each prior art probe, operated in conjunction with its associated interface unit, allows an MR system to generate images of, and spectroscopic results for, various internal organs such as the prostate gland, colon or cervix. Such intracavity probes typically include a shaft and a balloon-type enclosure on the distal end thereof in which a local coil is housed. The shaft has an inflation lumen that allows the balloon to be deflated during insertion and extraction of the distal end of the probe into and from the body opening. When properly positioned in the opening, the balloon can be inflated to bring the local coil therein into close proximity to the internal organ to be imaged. An output cable routed through another lumen in the shaft connects the local coil to an external plug which is used to connect the intracavity probe to its associated interface device.

Examples of such intracavity probes include the BPX-15 prostate/endorectal coil, the PCC-15 colorectal coil, the BCR-15 cervix coil and the BPX-30 prostate/endorectal coil, all of which produced by MEDRAD, Inc. Examples of the interface devices used with these intracavity probes include the single-channel ATD-II, the 4-channel ATD-Torso, the 4-channel 1.5 T MR64ERA, the 8-channel 1.5 T M64ERA8-HD, the 8-channel 3.0 T M128ERA8-HD units and the 1.5 T & 3.0 T interface devices for various scanners manufactured for Siemens and Philips, also produced by MEDRAD, Inc.

The ATD-II interface device is used to interface the BPX-15 probe with one receiver of an MR system to provide images or spectra of the prostate gland. The multi-channel interface devices are used to interface not only one or more of the prior art probes but also the MEDRAD Torso Array with multiple receivers of the MR system. For example, when the 4-channel 1.5 T MR64ERA interface device is connected to the BPX-15 probe and the Torso Array, the MR64ERA interface device allows the MR system to provide images or spectra not only of the prostate gland but also of the surrounding anatomy, i.e., the abdominal, thoracic and pelvic regions.

Heretofore, intracavity probes have been designed with only single loop coils, albeit each with circuitry uniquely fashioned so that the loop coil is tuned and electrically balanced to operate with MR systems of a particular field strength. These prior art probes therefore exhibit the same disadvantage as other linear coils, namely an ability to detect only one of the two quadrature components of the MR signals.

It would therefore be desirable to introduce an intracavity probe whose internal coil structure is sensitive to both the vertical and horizontal components of the MR signal. A quadrature coil designed for intracavity probe usage, however, must be as small and as flexible as possible. It must be able to fit within a balloon or other suitable enclosure that is expandable (inflatable) and collapsible (deflatable) and thus enable the enclosure of the probe to be insertable into and through the aforementioned body openings so that the quadrature coil therein can be positioned in close proximity to the internal organ to be imaged, all with minimal discomfort to the patient. A quadrature coil structure such as the one disclosed in U.S. Pat. No. 4,816,765 above would not suffice. Its stacked two-element structure makes it difficult to achieve optimal SNR because the separate elements must be precisely aligned to avoid cross coupling between them. Even with optimal alignment, the ability of the stacked structure to detect both the vertical and horizontal components of the MR signal is inherently compromised.

It would therefore be desirable to invent a single-element quadrature coil, and associated interface devices therefor, suitable for use in intracavity probes and for other surface coil offerings. For intracavity probe offerings, it would be ideal for the quadrature coil to be as small as possible so that it can be readily incorporated within a suitable enclosure therefor and be easily insertable into and manipulatable within the aforementioned body openings. In all manifestations, it would be ideal for such a quadrature coil to be as flexible as possible so as to enable it to conform to the surface of the patient, or an internal organ therein, and thus be placed as close as possible to the underlying region of interest. In doing so, such a quadrature coil would provide greater coverage and improved SNR performance as compared to prior art quadrature coils.

SUMMARY OF THE INVENTION

In a presently preferred embodiment of the present invention, a quadrature coil is capable of use with an MR system for obtaining images or spectra of a region of interest. The quadrature coil includes a flexible substrate of a dielectric material, a first conductor pattern bonded to one side of the flexible substrate and a second conductor pattern bonded to the opposite side of the flexible substrate. The first conductor pattern includes an outer conductive loop having a generally symmetrical shape and defines a drive gap at one end thereof and a first tuning gap at the other end thereof. The second conductor pattern includes a drive conductive segment and a tuning conductive segment. The drive conductive segment overlaps the drive gap symmetrically and forms with the outer conductive loop opposite thereto and the flexible substrate therebetween a first drive capacitor and a second drive capacitor of approximately equal value with a junction node therebetween. The tuning conductive segment overlaps the first tuning gap and forms with the outer conductive loop opposite thereto and the flexible substrate therebetween a first tuning capacitor and a second tuning capacitor having approximately equal values with a common node thereof being situated diametrically opposite the junction node. The outer conductive loop and the drive and tuning conductive segments form a simple loop-type coil in which the first and second drive capacitors form at the junction node thereof a virtual ground for electrically balancing and impedance matching the simple loop-type coil. The first and second tuning capacitors also enable the simple loop-type coil to resonate at the operating frequency of the MR system and thus to detect MR signals oriented orthogonal to a plane of the quadrature coil. The first conductor pattern also includes an inner conductive segment deployed between the drive and first tuning gaps but unconnected to both the outer conductive loop and the drive and first tuning gaps therein. The second conductor pattern also includes a center conductive segment extending between the drive and tuning conductive segments and defining a second tuning gap therein. The inner conductive segment overlaps the second tuning gap and forms with the center conductive segment opposite thereto and the flexible substrate therebetween a third tuning capacitor whose reactance equals an inductive reactance of the inner and center conductive segments at the operating frequency. This enables the inner and center conductive segments to be tuned with the simple loop-type coil to form a butterfly-type coil therewith for detecting MR signals oriented parallel to the plane of the quadrature coil. The resulting single structure quadrature coil is enabled to detect both the vertical and horizontal components of the MR signals emanating from the region of interest of the patient.

In a broader aspect, the present invention provides a quadrature coil for use with an MR system for obtaining images or spectra of a region of interest. The quadrature coil includes an outer loop and a center conductor bisecting the outer loop. The outer loop is designed to detect MR signals oriented orthogonal to a plane of the quadrature coil. The outer loop has a plurality of capacitors including a first drive capacitor and a second drive capacitor of approximately equal value serially deployed within the outer loop and at a junction node thereof forming a virtual ground for electrically balancing and impedance matching the outer loop. The outer loop also includes a first tuning capacitor and a second tuning capacitor serially deployed within the outer loop with a common node thereof being situated diametrically opposite the junction node. The first and second tuning capacitors have approximately equal values selected to resonate the outer loop at the operating frequency of the MR system. The center conductor extends between the common node and the junction node of the outer loop. The center conductor has equal capacitive and inductive reactance at the operating frequency and is tuned with the outer loop to form a butterfly-type coil therewith for detecting MR signals oriented parallel to the plane of the quadrature coil. The resulting single structure quadrature coil is enabled to detect both the vertical and horizontal components of the MR signals emanating from the region of interest of the patient.

In a related aspect and presently preferred embodiment of the present invention, an interface device is capable of interfacing a quadrature coil with an MR system. The quadrature coil has first and second ports each of which capable of outputting during the receive cycle voltage signals representative of MR signals of horizontal and vertical orientation originating from a region of interest of a patient such that the voltage signals representative of the MR signals of horizontal orientation output by the first and second ports are 0 degrees apart and the voltage signals representative of the MR signals of vertical orientation output by the first and second ports are 180 degrees apart. The interface device includes first and second phase shifting networks, first and second power splitters, a zero degree combiner and a 180 degree combiner. Connectable across the first port of the quadrature coil, the first phase shifting network enables the phase of the voltage signals received therefrom to be shifted 90 degrees. Connectable across the second port of the quadrature coil, the second phase shifting network enables the phase of the voltage signals received therefrom to be shifted 90 degrees. The first splitter divides the voltage signals phase shifted by the first phase shifting network, and the second splitter divides the voltage signals phase shifted by the second phase shifting network. The zero degree combiner constructively combines the voltage signals representative of the MR signals of horizontal orientation received from the first splitter and the voltage signals representative of the MR signals of horizontal orientation received from the second splitter. It also destructively cancels the voltage signals representative of the MR signals of vertical orientation received from the first splitter with the voltage signals representative of the MR signals of vertical orientation received from the second splitter. The 180 degree combiner constructively combines the voltage signals representative of the MR signals of vertical orientation received from the first splitter and the voltage signals representative of the MR signals of vertical orientation received from the second splitter. It also destructively cancels the voltage signals representative of the MR signals of horizontal orientation received from the first splitter with the voltage signals representative of the MR signals of horizontal orientation received from the second splitter. Preferably, the interface device also includes two preamplifier networks, the first of which disposed between the first phase shifting network and the first splitter and the second disposed between the second phase shifting network and the second splitter.

Optionally, the interface device can further include a 90 degree hybrid coupler for combining the voltage signals representative of the MR signals of horizontal orientation received from the zero degree combiner and the voltage signals representative of the MR signals of vertical orientation received from the 180 degree combiner.

BRIEF DESCRIPTION OF THE DRAWINGS

The invention and its presently preferred and alternative embodiments will be better understood by reference to the detailed disclosure below and to the accompanying drawings, wherein.

DETAILED DESCRIPTION OF THE INVENTION

In all of its embodiments and related aspects, the present invention disclosed below is ideally used with magnetic resonance (MR) systems designed to operate at field strengths of 1.0 to 3.0 Tesla or any value in between, though it may also be designed for use with MR systems operable at lower or higher field strengths. The technology is applicable to scanners whose magnets are configured with horizontal or vertical bore orientations or hybrid variations, and with open or closed bores.

Although the invention is described herein in a specific implementation, i.e., as a quadrature endorectal coil—which is capable of being incorporated within a suitable housing to form an intracavity probe insertable into the rectum to obtain images and/or spectra of the prostate gland, it should be understood that the invention is equally capable of being adapted to obtain images of and/or spectra from other regions of interest such as those accessible through the mouth, the vagina or other orifices penetrable by an intracavity probe. It should also be apparent that the principles presented herein may also be applied to a wide variety of surface coil arrays such as those intended for imaging of the neck, torso, limbs and other structures of the body.

FIGS. 3-11 illustrate the present invention, namely a single-element quadrature endorectal coil and an interface device therefor for interfacing the coil with the appropriate input port(s) of an MR system. In all embodiments, the quadrature endorectal coil of the present invention is manifested as a single-element structure sensitive to both the vertical and horizontal components of the MR signal.

Figure 4:
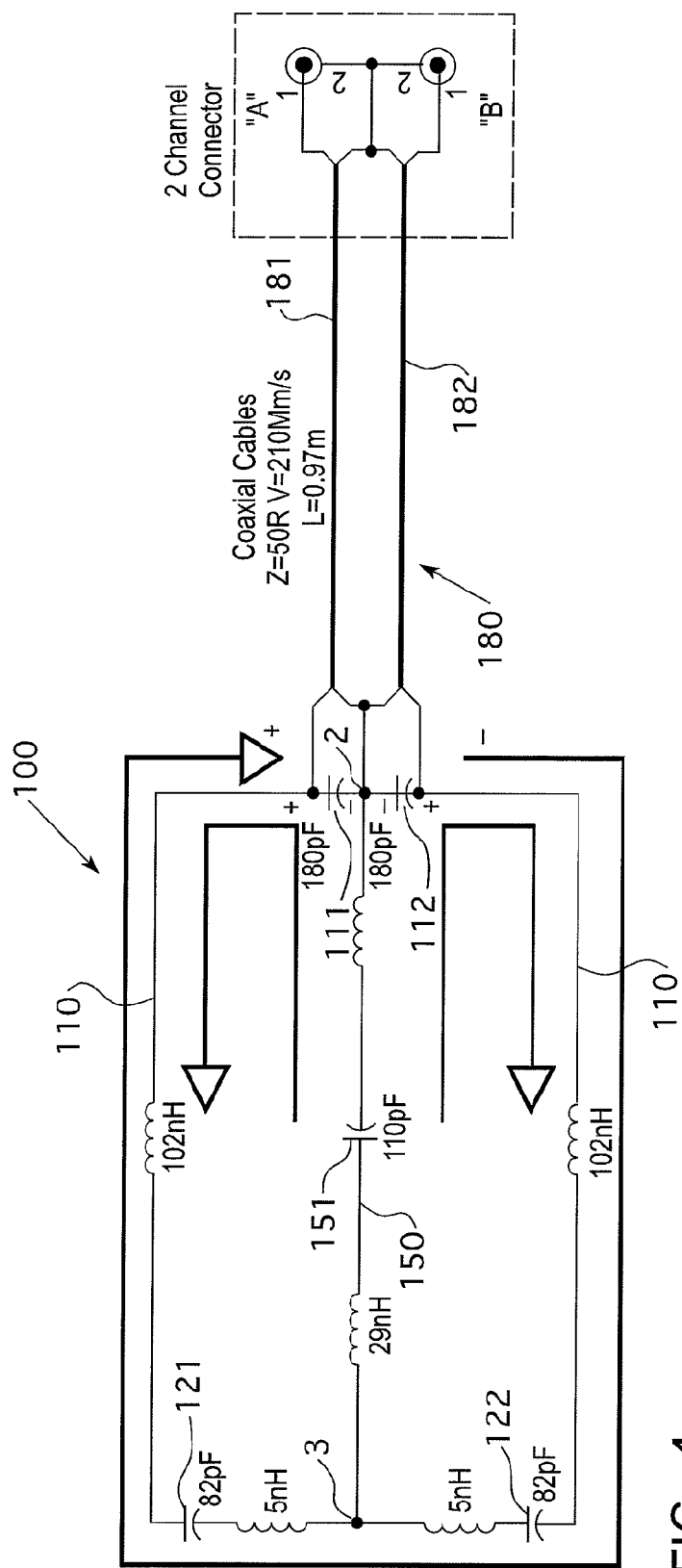
FIG. 4 is a detailed schematic diagram of a quadrature endorectal coil of the present invention designed to operate with 1.5 T MR systems.

FIG. 4 is a schematic diagram of the quadrature endorectal coil of the present invention designed to operate with 1.5 T MR systems. The quadrature coil, generally designated 100, includes an outer loop 110, a center conductor 150 bisecting outer loop 110, and an output line 180. The outer loop 110 includes a plurality of capacitors including first and second drive capacitors 111 and 112 and first and second tuning capacitors 121 and 122. Of approximately equal values, the drive capacitors 111 and 112 are serially deployed within the outer loop 110 and at their junction node 2 form a virtual ground for electrically balancing and impedance matching the loop. Tuning capacitors 121 and 122 are also serially deployed within outer loop 110, with their common node 3 being situated diametrically opposite the junction node 2. Of approximately equal values, the tuning capacitors 121 and 122 are selected to resonate the outer loop 110 at the operating frequency of the MR system. In that regard, outer loop 110 is shown in FIG. 4 as having four inductors. The values of those inductors merely represent the inductances inherent in the conductive (e.g., copper) segments of the loop. The values of the capacitors in outer loop 110 have been chosen so that the capacitive reactances of the loop are equal in magnitude to the inductive reactances of the loop at the operating frequency. Discrete inductors may also be incorporated into outer loop 110 for that purpose.

In this manner, the outer loop 110 of FIG. 4 has been tuned to detect MR signals emanating from the patient at the operating frequency of a 1.5 T MR system. The shape of outer loop 110 dictates that the loop is capable of detecting only those MR signals whose field lines are oriented vertical to the plane of the loop. The aforementioned tuning scheme, however, also imposes a 180 degree phase shift upon the resulting voltage signals output by outer loop 110 representative of the vertically oriented MR signals it detects. Specifically, relative to the virtual ground at junction node 2, the phase of the voltage signals detectable across first drive capacitor 111, i.e., at the first port, is 180 degrees from the phase of the voltage signals detectable across second drive capacitor 112, i.e., at the second port. The significance of this phase differential becomes apparent in connection with the operation of the interface device discussed below.

Figure 5:
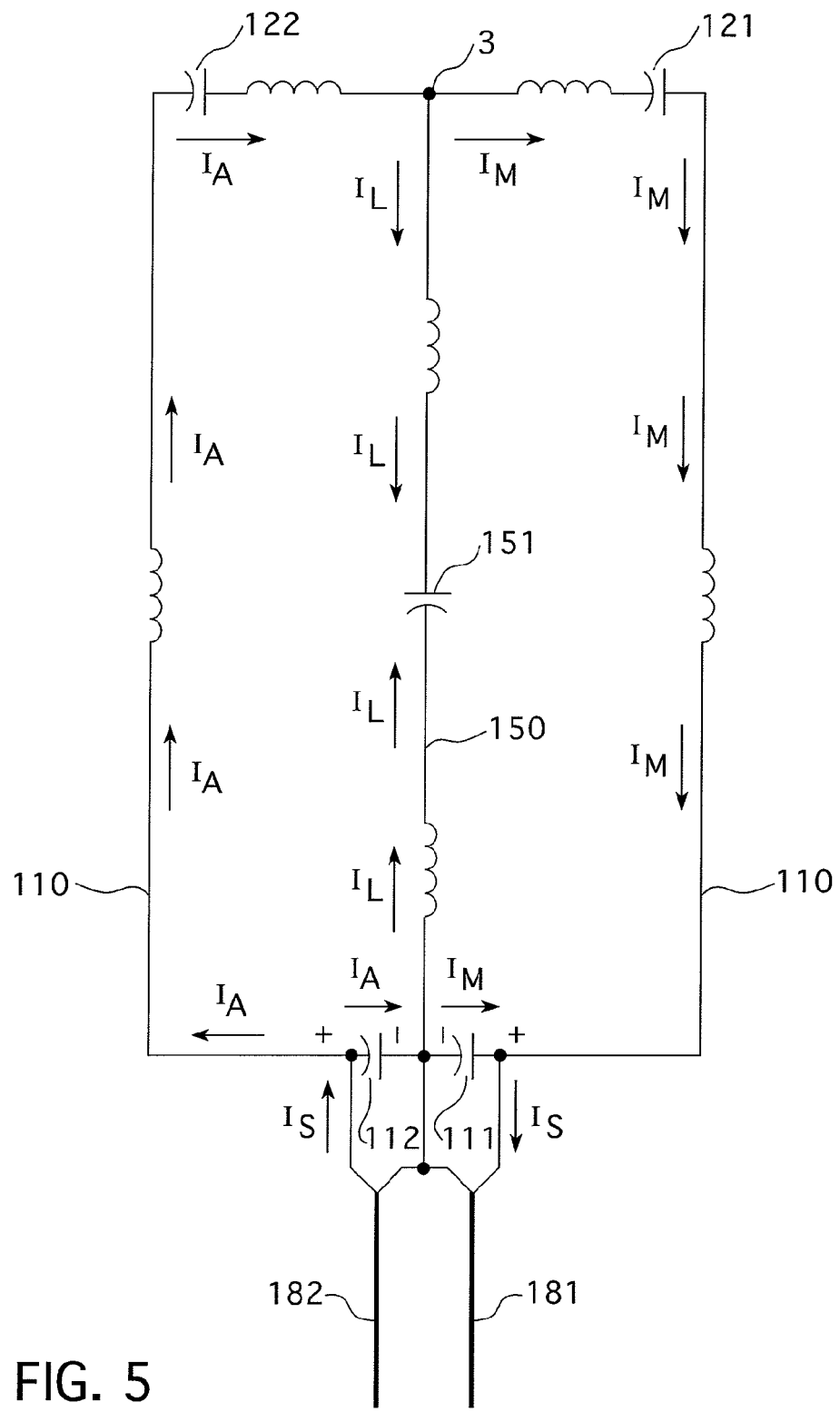
FIG. 5 shows how current induced by the vertical components of the MR signal flows within the outer loop of the quadrature coil shown in FIG. 4.

The center conductor 150 extends between and evenly bisects the junction and common nodes 2 and 3 of outer loop 110, and thus maintains the physical and electrically symmetry of quadrature coil 100. FIG. 4 shows the center conductor 150 as having two inductors and a tuning capacitor 151 symmetrically deployed along its length. Like outer loop 110, the values of those inductors merely represent the inductances inherent in the conductor. The value of the tuning capacitor 151 has been selected so that its reactance at the operating frequency equals the inductive reactance of center conductor 150. This permits two modes of operation to occur simultaneously. First, the equal inductive and capacitive reactances enable center conductor 150 to act as an open circuit relative to outer loop 110. Specifically, as shown in FIG. 5, during the receive cycle, the current induced by the vertically oriented MR signals within outer loop 110 can be represented by $I_S$, as it is the signal current shown flowing into and out of the loop. Due to the physical and electrical symmetry of quadrature coil 100, $I_S$ splits into two equal currents upon entering the loop, specifically as $$I_S = I_A + I_A$$

As the two $I_A$ currents reach the opposite ends of center conductor 150, each splits into two other currents, one of which being the main loop current $I_M$ which remains in outer loop 110 and the other being a leakage current $I_L$ which may leak into center conductor 150.

$$I_A = I_M + I_L$$

Due to the symmetry of the quadrature coil, both branches of the main loop current are equal as are both branches of the leakage current.

$$I_M = I_M \text{ and } I_L = I_L$$

Because the two leakage currents flow into center conductor 150 from opposite ends of the outer loop 110, they are opposite in sign and thus cancel each other out. Meanwhile, the two main loop currents, one flowing from the far side of the loop to the first port and the other flowing from across the second and first capacitors 112 and 111 combine at the first port to re-form the signal current $I_S$.

$$I_S = I_A + I_A = (I_M + I_L) + (I_M - I_L) = 2 I_M$$

Essentially no net current flows in center conductor 150 during the receive cycle thus enabling center conductor 150 to act as an open circuit relative to the current flowing in outer loop 110.

Figure 6:
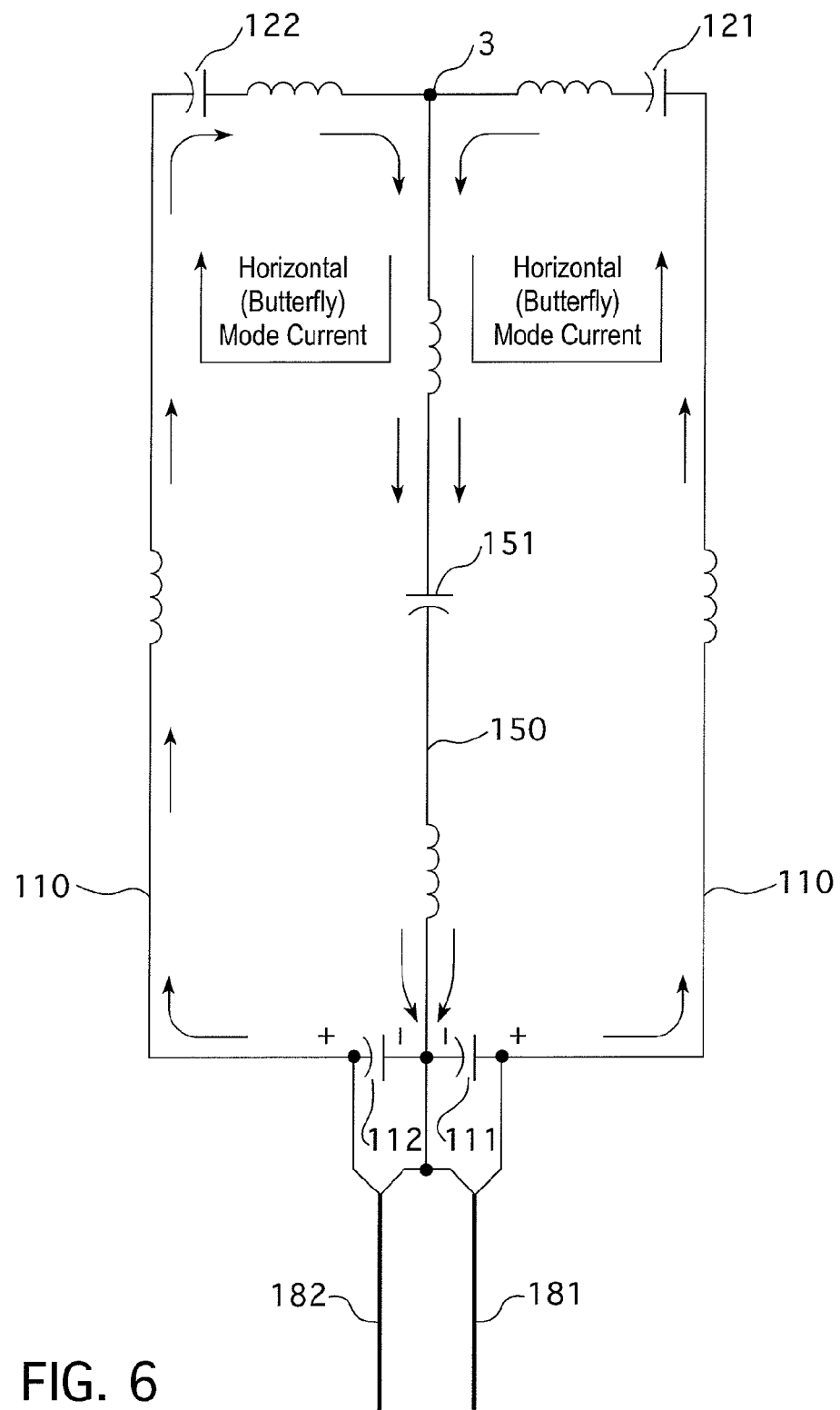
FIG. 6 shows how current induced by the horizontal components of the MR signal flows within the butterfly-type structure formed within the quadrature coil shown in FIG. 4.

Beyond acting as an open circuit for outer loop 110 to enable detection of the vertical components of the MR signal, center conductor 150 also operates with outer loop 110 to emulate a butterfly-type coil for detecting MR signals oriented parallel to the plane of quadrature coil 100. The tuning scheme of the present invention creates not only a simple loop current path for outer loop 110 but also an alternative current path—involving counter-rotating currents—for the outer loop 110 and center conductor 150 combined. This is best shown in FIG. 6. Specifically, during the receive cycle and starting near junction node 2, the current induced by the horizontally oriented MR signals flows across second drive capacitor 112 up to the far end of outer loop 110 and into and down center conductor 150. It then crosses the midpoint of the butterfly structure and flows across first drive capacitor 111 up to the far end of outer loop 110 and into and down center conductor 150 to start the cycle anew as long as quadrature coil 100 is in position to detect MR signals during the receive cycle of operation.

The center conductor 150 and outer loop 110 of FIG. 4 have therefore also been tuned to detect MR signals whose field lines are oriented horizontal to the plane of quadrature coil 100. This is because they have been tuned to emulate a butterfly-type coil in whose identically-shaped subloops the induced current is the same magnitude but flows in counter-rotating directions. Although not physically formed by twisting a conductive loop in the middle to form two subloops about a midpoint as is the case with prior art butterfly coils, the coil structure of the present invention nevertheless electrically emulates the operation of a butterfly coil in addition to a simple loop as described above in connection with outer loop 110.

Unlike for the voltage signals indicative of the vertically oriented MR signals, the tuning scheme does not impose a phase shift upon the resulting voltage signals attributable to the horizontally oriented MR signals detected by the butterfly-type structure. Specifically, relative to the virtual ground at junction node 2, the phase of the "horizontal" voltage signals detectable across first drive capacitor 111 at the first port is the same as (i.e., 0 degrees relative to) the phase of the "horizontal" voltage signals detectable across second drive capacitor 112 at the second port. The significance of this zero degree phase differential becomes apparent in connection with the operation of the interface device discussed below.

The output line 180 for quadrature coil 100 can be implemented using various mechanisms such as coaxial cable, stripline, microstrip or other transmission line technologies. FIG. 4 shows two coaxial cables 181 and 182 with the shield conductor of each connected to junction node 2 of the coil. The center conductor of cable 181 connects to the other side of first drive capacitor 111, while the center conductor of cable 182 connects to the other side of second drive capacitor 112. Alternatively, a single coaxial cable having dual inner conductors may be used. In this case, the sole shield conductor would connect to junction node 2 while one inner conductor connects across the first drive capacitor 111 at the first port and the other inner conductor connects across the second drive capacitor 112 at the second port. Either way, the drive capacitors 111 and 112 provide a means to bifurcate the voltage signals output by the quadrature coil 100 and to reference them to the shield conductor.

However implemented, the output line 180 should have an electrical length of $S_L+n(\lambda/4)$ for the reasons disclosed in U.S. application Ser. No. 11/719,253 (published as U.S. Patent Application Publication 2009/0076378A1), which is assigned to the assignee of the present invention and incorporated herein by reference. As disclosed in the '253 application, is the wavelength of the operating frequency of the MR system and n is an odd integer whose value will typically be (and is hereinafter treated as being) equal to 1 as the quadrature coil 100 will in practice always be reasonably close to the interface device to which it will connect. $S_L$ represents an additional length whose inductive reactance is of the same magnitude as the reactance of each of the first and second drive capacitor 111/112 across which the terminals of output line 180 connect.

Using the two coaxial cable option as an example, with an electrical length of $_{SL}+\lambda/4$ for the center and shield conductors of each, each coaxial cable 181 and 182 is designed to be connectable to a 90 degree phase shifting network. For that reason, the interface device disclosed below features two such phase shifting networks, one for each coaxial cable of quadrature coil 100. With a standard plug affixed to the end of each cable (or with a single plug accommodating the conductors of both cables), the center and shield conductors of each cable 181 and 182 connect to a suitable socket or other type connector for the interface device so as to connect each cable to its corresponding phase shifting network in the interface device.

Figure 1:
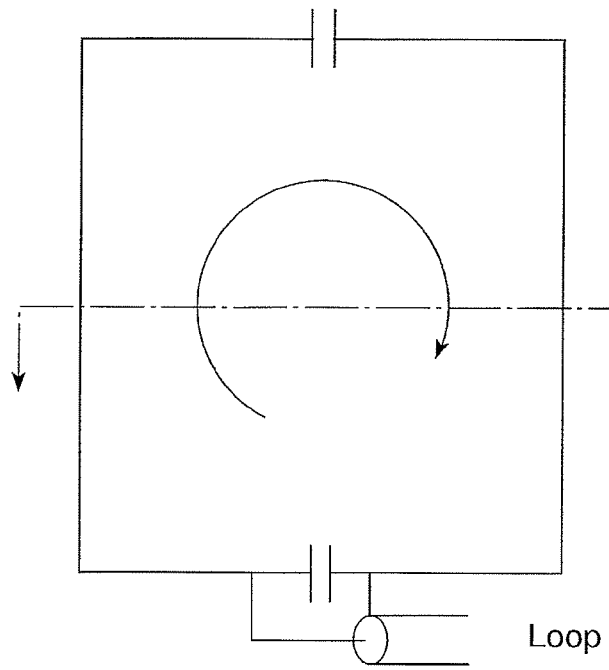
FIG. 1 shows a schematic diagram of a single loop coil and the vertically oriented magnetic fields it is capable of sensing.
Figure 1:
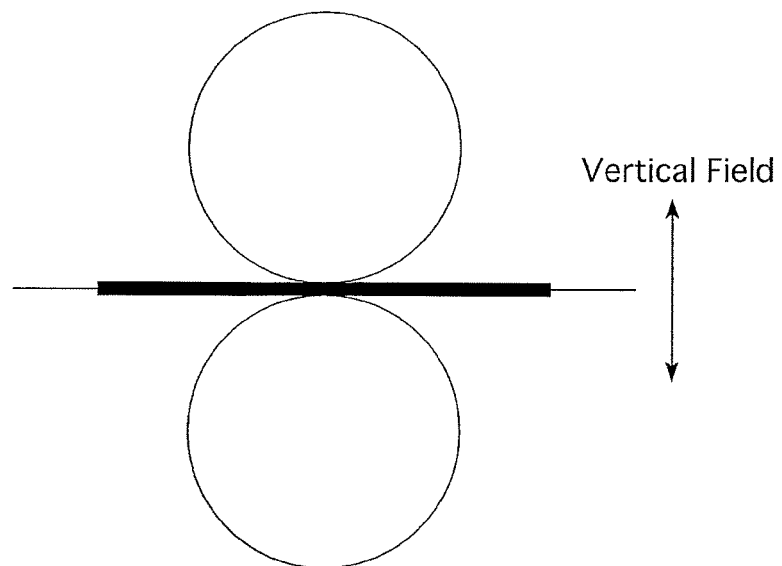
Figure 2:
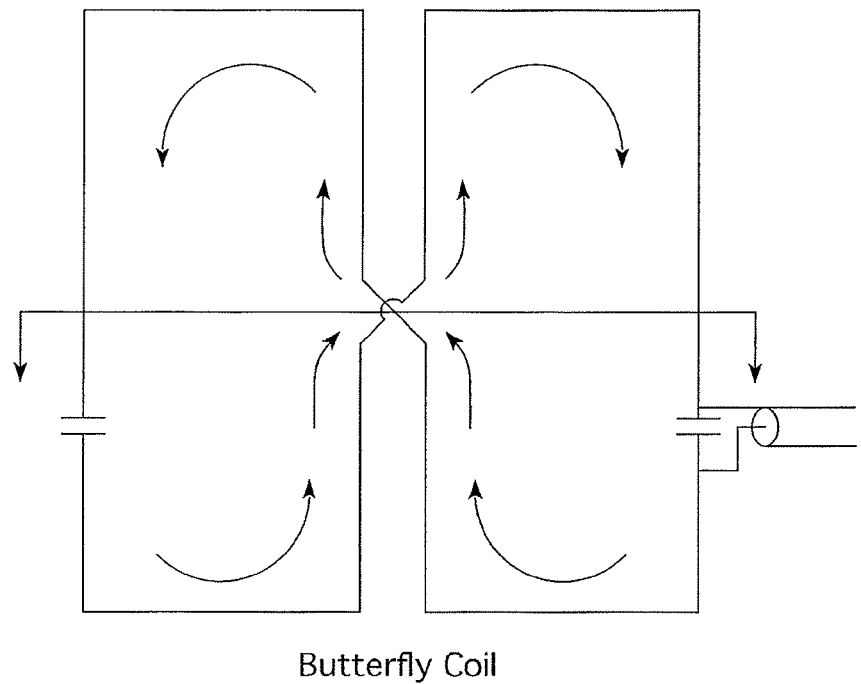
FIG. 2 shows a schematic diagram of a butterfly coil and the horizontally oriented magnetic fields it is capable of sensing.
Figure 2:
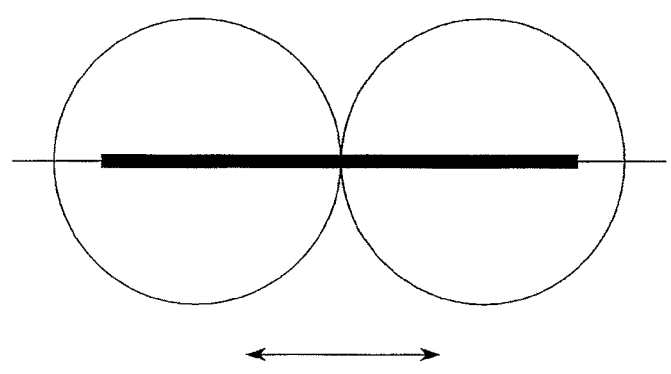
Figure 3:
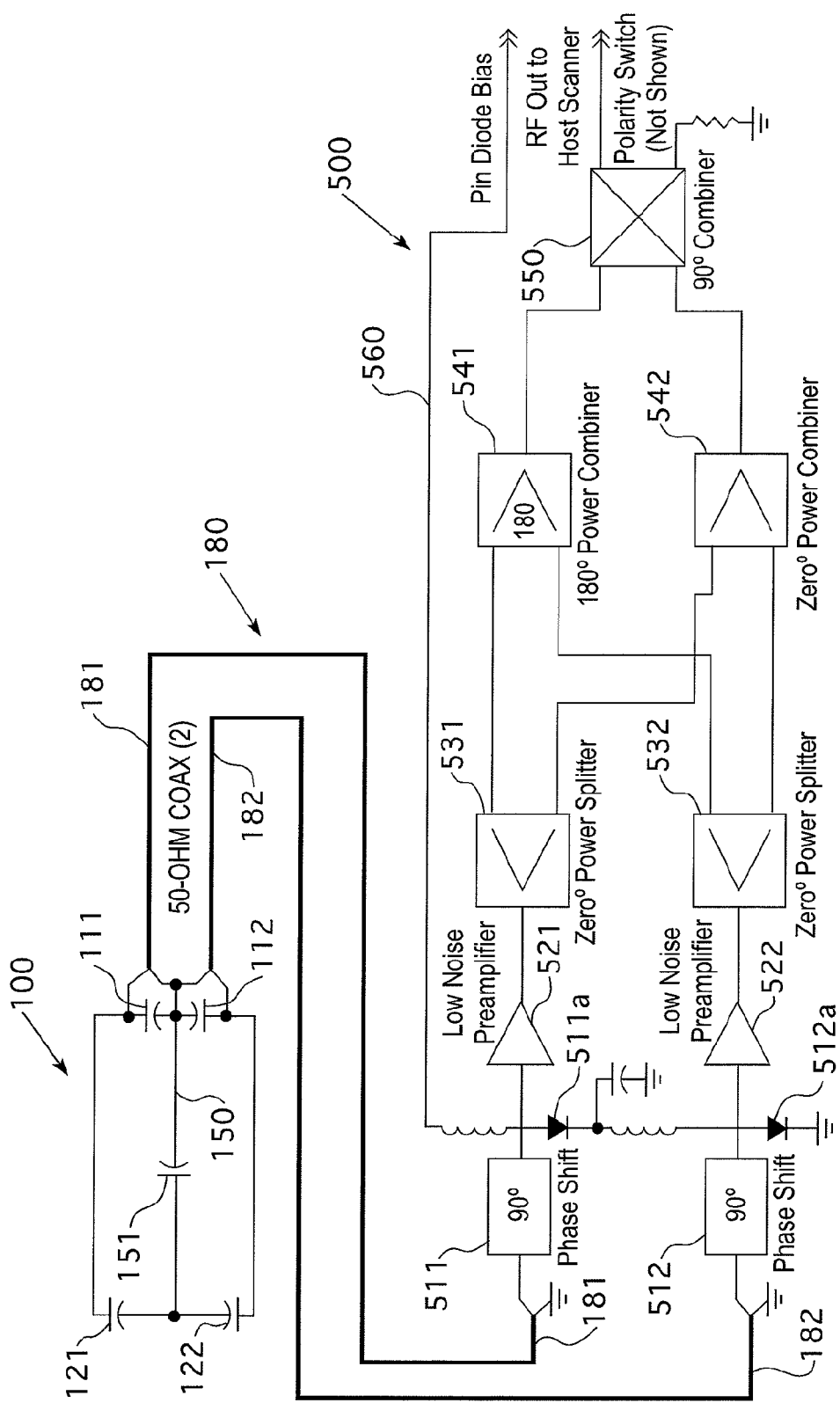
FIG. 3 is a simplified schematic diagram of a quadrature endorectal coil and an interface device therefor according to the present invention.
Figure 7A:
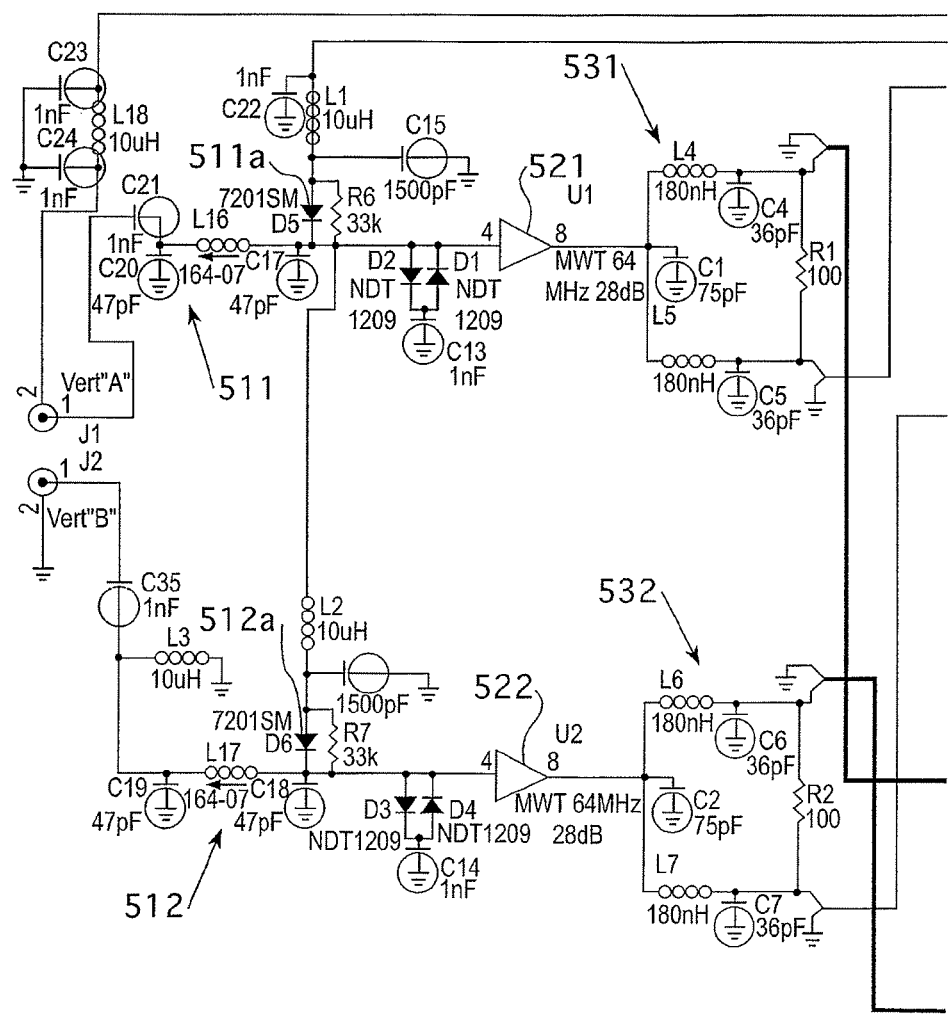
FIG. 7 is a detailed circuit diagram of an interface device for the quadrature endorectal coil of the present invention.
Figure 7B:
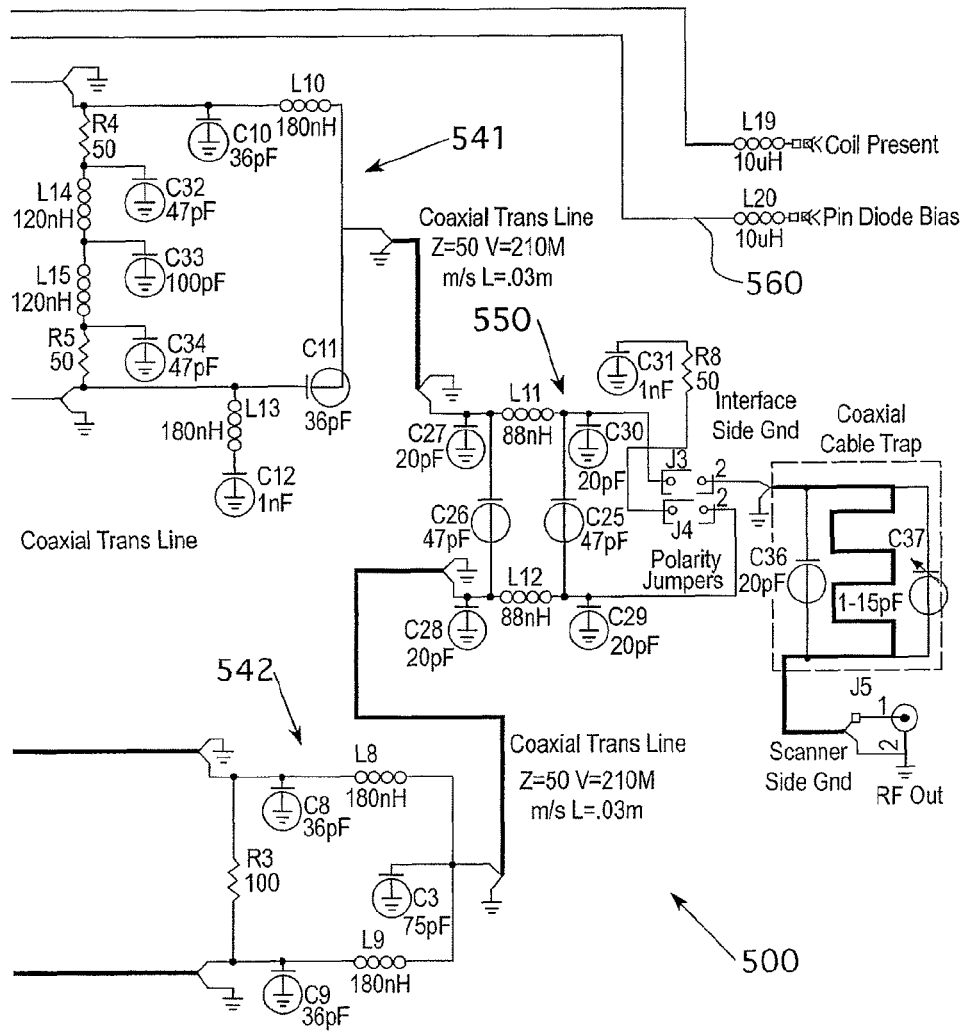

FIGS. 3 and 7 illustrate a preferred embodiment of an interface device, generally designated 500, for interfacing the quadrature coil 100 with the appropriate input port(s) of a 1.5 T MR system. FIG. 3 illustrates the interface device 500 in flowchart form, while FIG. 7 depicts a detailed circuit diagram for same.

The interface device 500 includes phase shifting networks 511 and 512, preamplifier networks 521 and 522, power splitting networks 531 and 532, a 180 degree combining network 541, and a zero degree combining network 542. The power splitting and combining networks may be implemented with standard Wilkinson style designs, and the preamplifier networks may ideally be realized with 28 dB nominal gain. The preamplifier networks 521 and 522 may be implemented using commercially available miniature low-noise, 28 dB gain shielded units with a tuned input circuit designed to present a low impedance (<5Ω real) at the Larmor frequency. Close proximity of the preamplifier networks 521/522 to their respective PIN diodes 511a/512a in view of the low impedance of the former allows some measure of isolation during the receive cycle from other surface coils (or arrays of same) used in conjunction with the quadrature coil. Passive protection diode networks shown in FIG. 7 are included in interface device 500 to prevent excessive RF voltage from damaging the preamplifier networks 521 and 522 during the RF transmit pulse should interface device 500 be disconnected while inside the bore of the MR system during the transmit cycle. These diode networks also provide some decoupling for the quadrature coil in the same scenario.

The power splitting networks 531 and 532 are used as 50 ohm/0 degree splitters at the outputs of the preamplifier networks 521 and 522. The two combining networks 541 and 542 are also configured as 50 ohm devices. As a result, these four networks may be interconnected as shown by means of four equal-phase length 50 ohm coaxial cable, PCB stripline, microstrip or other transmission line media. Optionally, as detailed below, a 90 degree hybrid combining network 550 may be required to combine the "vertical" voltage signals output by the 180 degree combining network 541 with the "horizontal" voltage signals output by the zero degree combining network 542. The resulting combined or quadrature voltage signals can then be provided to a single input of the MR system to which the interface device is linked.

The interface device 500 also includes two PIN diodes 511a and 512a, with diode 511a connected across the output of phase shifting network 511 and diode 512a connected across the output of phase shifting network 512. The phase shifting networks each implement a 90 degree (or λ/4 radian) shift of the voltage signals inputted thereto from quadrature coil 100 via output line 180 for the reasons specified below.

Having set forth the components of the present invention, the operation of interface device 500 can now be explained. It performs essentially two sets of functions. As for the first set, the phase shifting networks 511/512 along with their corresponding PIN diodes 511a/512a operate in conjunction with the first and second drive capacitors 111/112 of quadrature coil 100 and their corresponding conductors of output line 180 to enable the quadrature coil 100 to be decoupled from the transmit field of the MR system during the transmit cycle and coupled to the appropriate input ports thereof during the receive cycle. In this regard only, these elements function collectively in a manner that is similar to the teachings of U.S. application Ser. No. 11/719,253 in connection with the preferred embodiments of the drive capacitors of the single loop endorectal coil, the output cable assembly, and the associated phase shift network disclosed therein. At a high level, during the receive cycle, each phase shifting network 511/512 enables quadrature coil 100 through its corresponding drive capacitor 111/112 to be coupled through its corresponding conductor 181/182 of output line 180 (through the remainder of the interface device) to an input port of the MR system and therein permits the MR signals received from its corresponding conductors to be routed to the input port. During the transmit cycle, each phase shifting network 511/512 enables the coil (through drive capacitors 111/112 respectively corresponding to networks 511/512) to be decoupled through the conductors (181/182 respectively corresponding to capacitors 111/112) of output line 180 from the transmit field of the MR system.

More specifically, during the transmit cycle, the MR system will forward bias PIN diodes 511a and 512a via biasing line 560. By turning on diodes 511a and 512a, the MR system causes a short-circuit to occur at the output of each phase shifting network 511/512 at an electrical length of λ/4 from the end of output line 180. With respect to the first port, the electrical length between first drive capacitor 111 and the short-circuit at the output of phase shifting network 511 is $S_L+\lambda/2$, with $S_L+\lambda/4$ due to output cable 181 and $+\lambda/4$ due to phase shifting network 511. Supplement length $S_L$, as noted in U.S. application Ser. No. 11/719,253 above, inherently acts as an inductor, and ideally has an inductive reactance whose magnitude is equal to that of the capacitive reactance of first drive capacitor 111. The λ/2 section, however, effectively appears as zero electrical length because it is one-half the operating wavelength. The effective electrical length between first drive capacitor 111 at the first port and PIN diode 511a is thus $S_L$ during the transmit cycle of the MR system. The forward biasing of diode 511a thus enables the inherent inductance of output cable 181 and the first drive capacitor 111 to form a parallel resonant circuit. The high impedance of this circuit approximates an open circuit, which effectively opens quadrature coil 100 around the point where first drive capacitor 111 connects within it. With respect to the second port, the electrical length between second drive capacitor 112 and the short-circuit at the output of phase shifting network 512 is also $S_L+\lambda/2$, with $S_L+\lambda/4$ due to output cable 182 and $+\lambda/4$ due to phase shifting network 512. The forward biasing of PIN diode 512a thus enables the inherent inductance of output cable 182 and the second drive capacitor 112 to form another parallel resonant circuit. The high impedance of that parallel resonant circuit effectively opens quadrature coil 100 around the point where second drive capacitor 112 connects within it. In the foregoing manner, the quadrature coil 100 is decoupled from the transmit field of the MR system during the transmit cycle.

It should also be noted that the quadrature coil 100 will decouple from the transmit field even while its output line 180 is disconnected from interface device 500. As noted above, each of the output cables 181 and 182 has an electrical length of $S_L+\lambda/4$. In each output cable, the supplemental length $S_L$, together with the corresponding drive capacitor to which it is connected, act as a source impedance and can be thought of as being connected to a transmission line whose length is the remaining λ/4 section of the output cable. As is well known, standing waves at the resonant frequency points of an open-circuited transmission line produce an unusual effect. In this case, where the length of the transmission line has been chosen to be exactly one quarter of the operating wavelength of the MR system (or some integer multiple thereof), the source will see the exact opposite of the impedance at the end of the transmission line. This technique is sometimes referred to as a quarter-wavelength impedance transformation.

During the receive cycle, the MR system will reverse bias PIN diodes 511a and 512a via biasing line 560, effectively turning them off. By open-circuiting diode 511a, the MR system makes it possible for the MR signals output from the first port (across first drive capacitor 111) to be conveyed via output cable 181 to the input of phase shifting network 511. Similarly, by open-circuiting diode 512a, the MR system makes it possible for the MR signals output from the second port (across second drive capacitor 112) to be conveyed via output cable 182 to the input of phase shifting network 512.

Having completed discussion of the first set of functions of interface device 500, description of the novel second set is now provided, all of which relating to operation of the present invention during the receive cycle of the MR system. As taught above, with respect to the vertically oriented MR signals detected by outer loop 210, the phase of the voltage signals detectable across first drive capacitor 211 at the first port will be 180 degrees from the phase of the voltage signals detectable across second drive capacitor 212 at the second port. With respect to the horizontally oriented MR signals detected by the butterfly-type structure, the phase of the voltage signals detectable across first drive capacitor 211 at the first port is the same as the phase of the voltage signals detectable across second drive capacitor 212 at the second port.

The quadrature coil 100 thus outputs voltage signals representative of MR signals of both horizontal and vertical orientation from each of its first and second ports 111 and 112. For ease of description, the voltage signals representative of the MR signals of horizontal orientation are referred to herein as "0 degree horizontal voltage signals" because they have the same phase at each port. The voltage signals representative of the MR signals of vertical orientation are referred to as "0 degree vertical voltage signals" for those output from first port 111 and "180 degree vertical voltage signals" for those output from second port 112.

In view of FIG. 3, the manner in which interface device 500 processes the voltage signals received from output line 180 is now described. The phase shifting network 511 shifts the 0 degree horizontal voltage signals and the 0 degree vertical voltage signals received from first drive capacitor/first port 111 via output cable 181 to 90 degree horizontal voltage signals and 90 vertical voltage signals, respectively. Similarly, phase shifting network 512 shifts the 0 degree horizontal voltage signals and the 180 degree vertical voltage signals received from second drive capacitor/second port 112 via output cable 182 to 90 degree horizontal voltage signals and −90 vertical voltage signals, respectively. Preamplifier network 521 and 522 each amplify the voltage signals they receive and pass the resulting amplified versions to power splitting networks 531 and 532, respectively.

Power splitting network 531 passes amplified versions of the 90 degree horizontal voltage signals and 90 vertical voltage signals to both 180 degree combining network 541 and zero degree combining network 542. Similarly, power splitting network 532 passes amplified versions of 90 degree horizontal voltage signals and −90 vertical voltage signals to both 180 degree combining network 541 and zero degree combining network 542. Because the horizontal voltage signals received from power splitting networks 531 and 532 are in phase, zero degree combining network 541 is able to constructively combine them. Simultaneously, zero degree combining network 541 also cancels the 90 vertical voltage signals received from power splitting network 531 with the −90 vertical voltage signals received from power splitting network 532. Similarly, because the vertical voltage signals received from power splitting networks 531 and 532 are out of phase by 180 degrees, 180 degree combining network 542 is able to constructively combine them. Combining network 542 cancels the horizontal voltage signals received from power splitting network 531 with the horizontal voltage signals received from power splitting network 532 because they are received in phase. Consequently, zero degree combining network 531 essentially reconstitutes the horizontal voltage signals that had been bifurcated by the design of quadrature coil 100 while 180 degree combining network 532 reconstitutes the vertical voltage signals.

Figure 8:
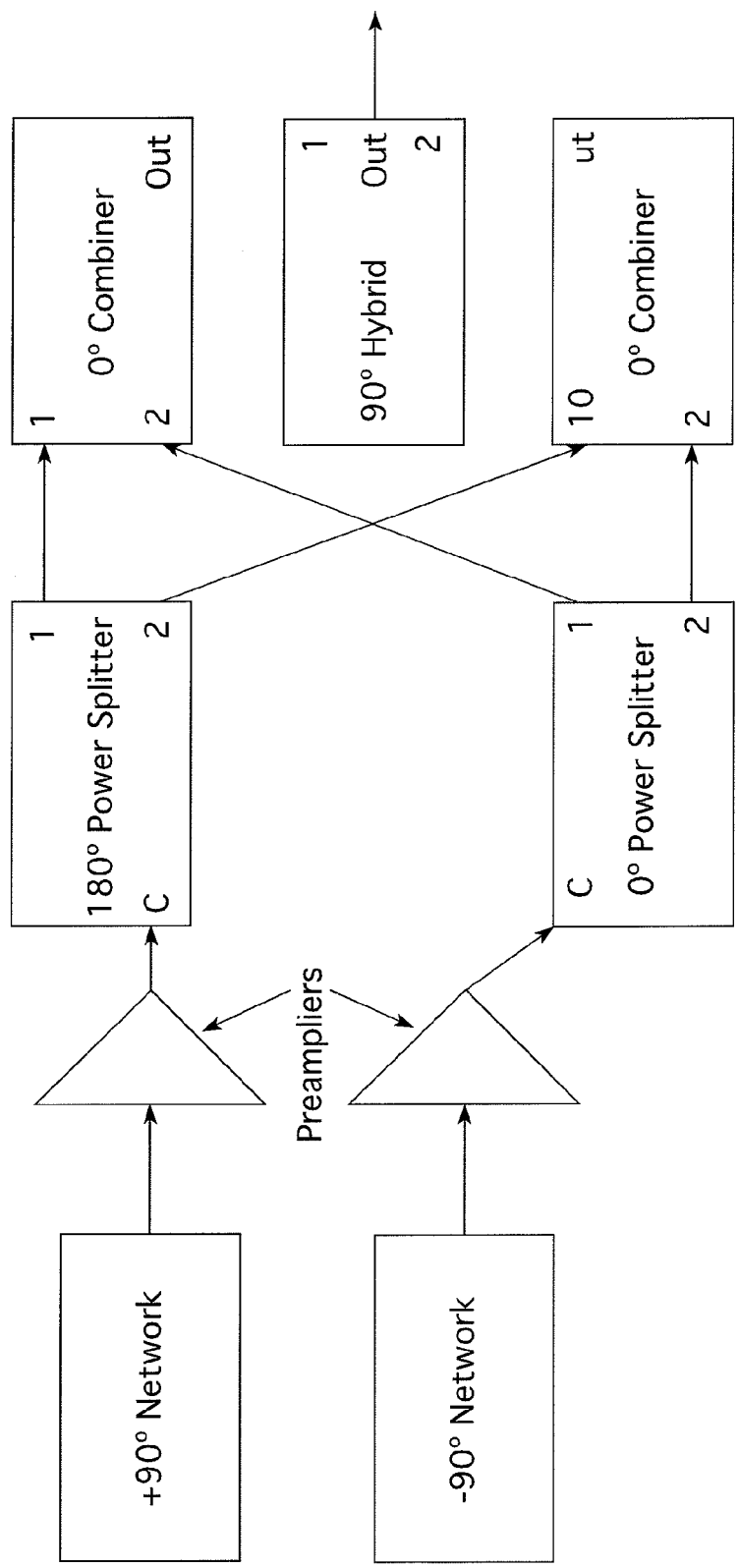
FIG. 8 illustrates in flowchart form another embodiment of the interface device.

The resulting horizontal and vertical voltage signals can be supplied to separate input ports of the MR system. Optionally, a 90 degree hybrid combining network 550 may be used to combine the horizontal and vertical voltage signals and provide the combined voltage signals indicative of quadrature to a single input port. FIGS. 3 and 7 both illustrate the 90 degree hybrid combining network. FIG. 8 illustrates yet another embodiment for the interface device in flowchart form.

Figure 9:
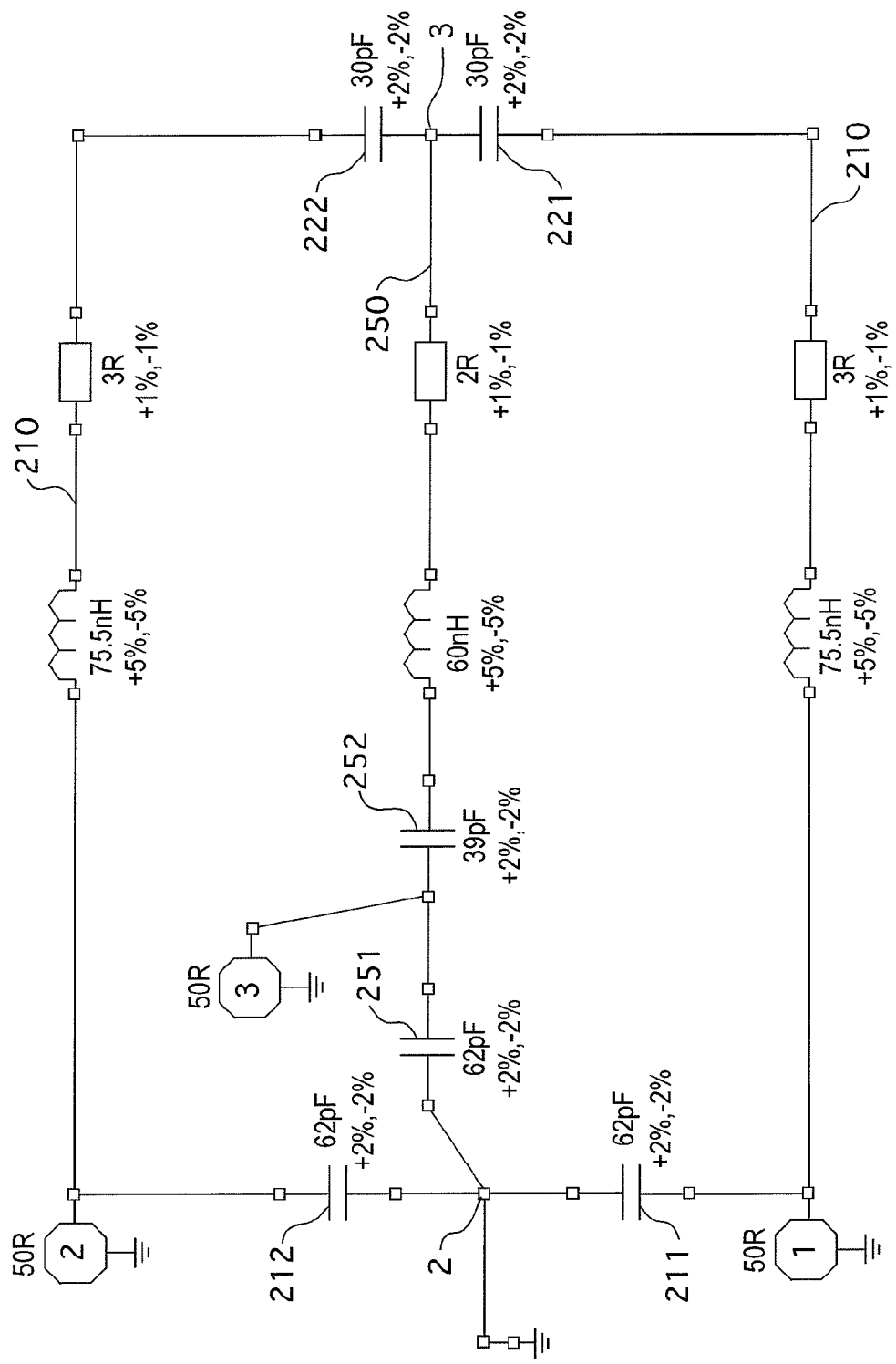
FIG. 9 is a detailed schematic diagram of a quadrature endorectal coil of the present invention designed to operate with 3.0 T MR systems.

FIG. 9 is a schematic diagram of the quadrature endorectal coil of the present invention designed to operate with 3.0 T MR systems. This quadrature coil, generally designated 200, is constructed in a manner very similar to that for the 1.5 T version described above. Like quadrature coil 100, it is intended for use with output line 180 disclosed herein regardless of the particular implementation chosen therefor (e.g., coaxial cable, stripline, microstrip or other transmission line technologies). Also like quadrature coil 100, it should exhibit symmetry in physical layout of outer loop 210 and center conductor 250 and deployment of the first and second drive capacitors 211/212 and the first and second tuning capacitors 221/222 in outer loop 210 and of the one or more tuning capacitors 251 and 252 in center conductor 250.

Outer loop 210 is shown as having two inductors and two resistors. The values of the inductors represent the inductances inherent in the loop, and the values of the resistors are representative of the inherent resistance. The values of the capacitors in outer loop 210 have been chosen so that the capacitive reactances of the loop are equal in magnitude to the inductive reactances of the loop at the operating frequency. As with outer loop 110 of quadrature coil 100, discrete inductors may also be incorporated into outer loop 210 for that purpose. The same is true with regard to the inductor and resistor shown in center conductor 250. As with center conductor 150, center conductor 250 should evenly bisect the junction and common nodes 2 and 3 of outer loop 210 to assure the physical and electrically symmetry of quadrature coil 200.

It should be apparent that the values of the circuit elements in outer loop 210 and center conductor 250 have been selected to enable quadrature coil 200 to operate with 3.0 T MR systems in the same manner as described above for quadrature coil 100 with 1.5 T MR systems. With respect to the vertically oriented MR signals detected by outer loop 210, the phase of the voltage signals detectable across first drive capacitor 211 at the first port will be 180 degrees from the phase of the voltage signals detectable across second drive capacitor 212 at the second port. With respect to the horizontally oriented MR signals detected by the butterfly-type structure, the phase of the voltage signals detectable across first drive capacitor 211 at the first port is the same as the phase of the voltage signals detectable across second drive capacitor 212 at the second port. These 180 and zero degree phase differentials for the "vertical" and "horizontal" voltage signals, respectively, output by quadrature coil 200 can be usefully exploited by the interface devices of the present invention as noted above.

It should be apparent that the quadrature coils of the present invention may be constructed of discrete components. Doing so, however, could yield a structure having up to five or six discrete capacitors. This does not compare favorably with the one or three discrete capacitors found within the simple loop coils contained inside the intracavity probes disclosed in the prior art cited in background.

Due to the desire for a small, flexible, damage-resistant intracavity probe whose design minimizes the likelihood of any internal componentry protruding through the balloon-type enclosure in which it is housed, the quadrature coil of the present invention is preferably constructed of a thin, flexible dielectric material with copper patterns applied to both sides to form not only the conductive pathways but also all of the capacitors required for tuning and decoupling. Moreover, as the quadrature coil is preferably intended to be offered as an integral part of a one-use disposable intracavity probe, such a fabrication technique will aid in the goal of realizing substantial savings during the manufacture of the probes. This is because the fabrication process for "pre-printed" quadrature coils will involve significantly less labor and less time to inspect the finished product as compared to coils made from discrete components. It is anticipated that additional reductions in cost will be realized from mass production of such pre-printed quadrature coils.

Figure 10:
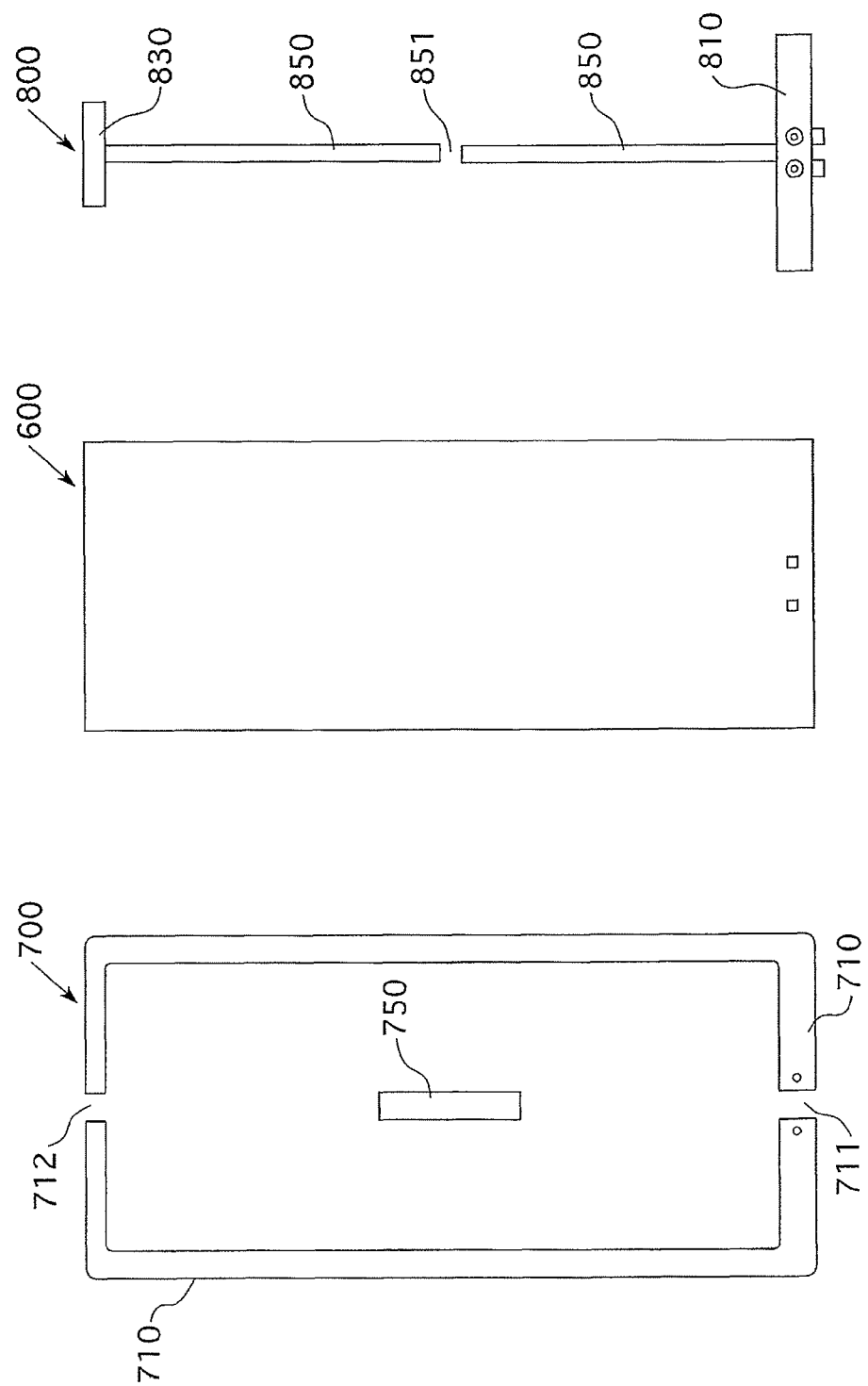
FIG. 10 illustrates, in separate layers, the quadrature coil of the present invention made from a thin, flexible dielectric substrate material to which has been bonded on either side complementary and differing conductor patterns to form the conductive pathways and the capacitors required for tuning and decoupling.

FIG. 10 illustrates how the quadrature coils of the present invention may be produced with a pre-printing process involving a flexible dielectric substrate material to which has been bonded on either side complementary and differing conductor patterns to form the conductive pathways and the capacitors required for tuning and decoupling.

Using such a process, the quadrature coil can be considered as including a flexible dielectric substrate material 600, a first conductor pattern 700 bonded to one side of the substrate and a second conductor pattern 800 bonded to the opposite side of the substrate. For ease of understanding, FIG. 10 shows these three layers separately, with the flexible substrate 600 in the middle flanked on the left and right by the first conductor pattern 700 and the second conductor pattern 800, respectively.

The first conductor pattern 700 includes an outer conductive loop 710 having a generally symmetrical shape. The loop 710 defines a drive gap 711 at one end and a first tuning gap 712 at the other end. The second conductor pattern 800 includes a drive conductive segment 810 and a tuning conductive segment 830. The drive conductive segment 810 overlaps drive gap 711 symmetrically and forms with outer conductive loop 710 opposite thereto and flexible substrate 600 therebetween the first drive capacitor 111/211 and the second drive capacitor 112/212 with junction node 2 therebetween. The tuning conductive segment 830 overlaps the first tuning gap 712 and forms with outer conductive loop 710 opposite thereto and flexible substrate 600 therebetween the first tuning capacitor 121/221 and the second tuning capacitor 122/222 with common node 3 thereof being situated opposite junction node 2. The outer conductive loop 710 and the drive and tuning conductive segments 810 and 830 thus form a simple loop-type coil in which the first and second drive capacitors form at junction node 2 a virtual ground for electrically balancing and impedance matching the simple loop-type coil and in which the first and second tuning capacitors enable the simple loop-type coil to resonate at the operating frequency. In this manner, the simple loop-type coil is enabled to detect MR signals oriented orthogonal to a plane of the quadrature coil.

The first conductor pattern 700 also includes an inner conductive segment 750 deployed between the drive and first tuning gaps 711 and 712 but unconnected to both the outer conductive loop 710 and the drive and first tuning gaps 711 and 712 therein. The second conductor pattern 800 also includes a center conductive segment 850 extending between drive conductive segment 810 and tuning conductive segment 830 and defines a second tuning gap 851 therein. The inner conductive segment 750 overlaps second tuning gap 851 and forms with center conductive segment 850 opposite thereto and flexible substrate 600 therebetween a third tuning capacitor 151/251 whose reactance equals an inductive reactance of the inner and center conductive segments 750 and 850 at the operating frequency. This enables the inner and center conductive segments 750 and 850 to be tuned with the simple loop-type coil to form a butterfly-type coil therewith for detecting MR signals oriented parallel to the plane of the quadrature coil. The resulting single structure quadrature coil 100/200 is enabled to detect both the vertical and horizontal components of the MR signals emanating from the region of interest of the patient.

It should be apparent that the two coaxial cable embodiment of output line 180 described above may be used to connect the flexible quadrature coil to the interface device 500. In this case, the ground and inner conductors of the cable would need to be soldered or otherwise mechanically affixed to junction node 2 and the first and second ports of the quadrature coil. The other transmission line technologies listed above would also suffice. A preferred technique would be to build the output line and the quadrature coil with the same pre-printing process, specifically by extending the substrate material and the conductor patterns thereon to create the electrical lengths necessary to achieve proper coupling and decoupling. In this example, the output line 180 would include a ground conductor bonded to one side of the flexible dielectric substrate 600 and first and second signal conductors bonded to the other side. The ground conductor would be connected to junction node 2 of the quadrature coil, while the first and second signal conductors would be connected across the first and second drive capacitors 111/211 and 112/212 at the first and second ports of the quadrature coil, respectively. Consistent with the foregoing, the first signal, second signal and ground conductors would each have an electrical length of $S_L+n(\lambda/4)$, all of which terminating in a plug for connecting the quadrature coil to an interface device therefor.

Figure 11:
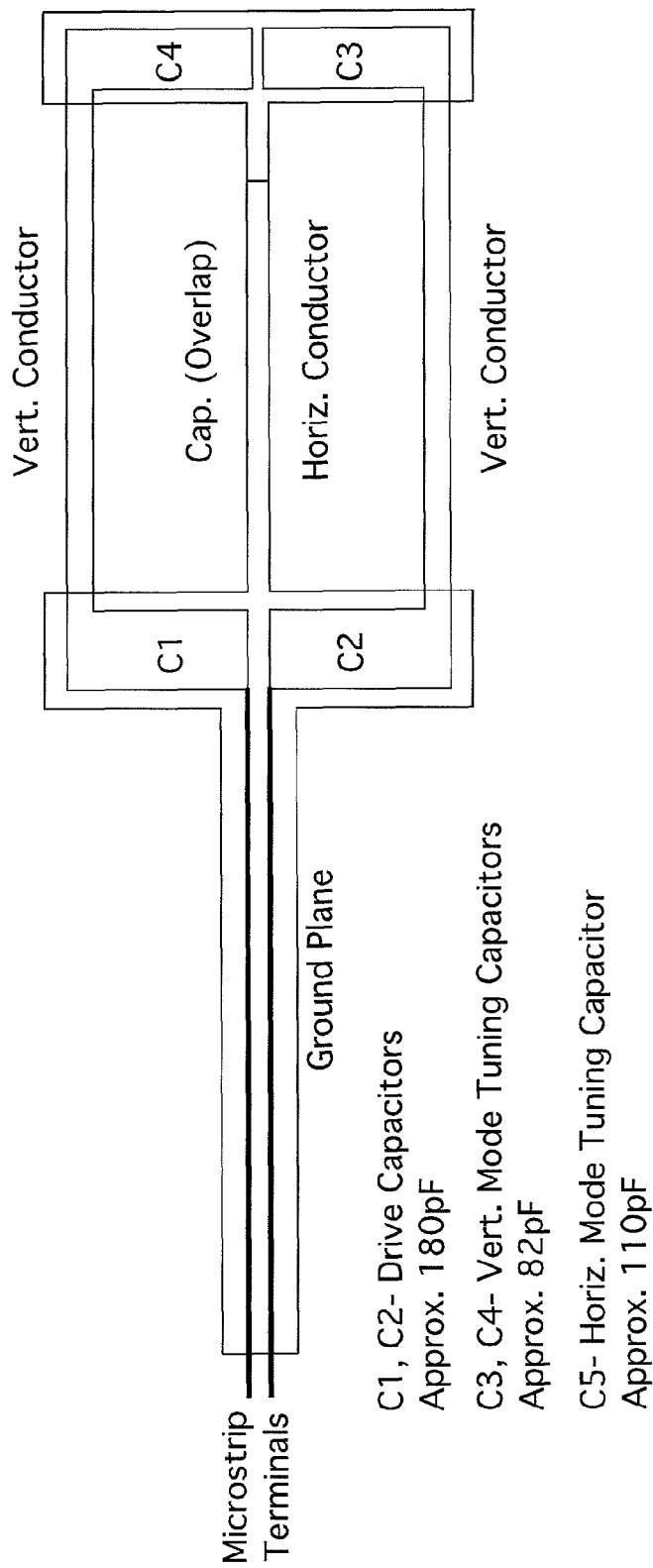
FIG. 11 illustrates a simplified schematic for an output line in the form of microstrip connected to the quadrature coil of flexible substrate design intended for operation with a 1.5 T MR system.

FIG. 11 shows output line 180 in the form of a microstrip line connected to the flexible quadrature coil 100 designed for operation with a 1.5 T MR system.

It should be emphasized that it is important to achieve symmetry in the layout of the first and second conductor patterns and their associated conductive loop and segments inclusive of the drive and tuning capacitors formed thereby. In this regard, in view of the foregoing teachings, it should now be apparent to those skilled in the relevant art to select the appropriate dimensions for the thicknesses, widths and lengths of the conductive pathways for the flexible quadrature coil inclusive of the output line 180.

The present invention thus addresses several disadvantages exhibited by the prior art intracavity probes including their limited coverage and sub-optimal SNR performance caused by not using the circularly polarized MR signal to its best advantage with a coil sensitive to both the horizontal and vertical components of the MR signal. The present invention also will reduce the difficulties and costs encountered during assembly by eliminating the discrete components heretofore used in making prior art endorectal coils and their corresponding output cables.

The presently preferred and alternative embodiments for carrying out the invention have been set forth in detail according to the Patent Act. Persons of ordinary skill in the art to which this invention pertains may nevertheless recognize alternative ways of practicing the invention without departing from the spirit of the following claims. Consequently, all changes and variations that fall within the literal meaning, and range of equivalency, of the claims are to be embraced within their scope. Persons of such skill will also recognize that the scope of the invention is indicated by the claims below rather than by any particular example or embodiment discussed or shown in the foregoing description.

Accordingly, to promote the progress of science and useful arts, we secure by Letters Patent exclusive rights to all subject matter embraced by the following claims for the time prescribed by the Patent Act.

What is claimed is:

1. A quadrature coil for use with a magnetic resonance (MR) system for obtaining images or spectra of a region of interest, said quadrature coil comprising:
   (a) an outer loop for detecting MR signals oriented orthogonal to a plane of said quadrature coil, said outer loop having a plurality of capacitors therein including (i) a first drive capacitor and a second drive capacitor of approximately equal value serially deployed within said outer loop and at a junction node thereof forming a virtual ground for electrically balancing and impedance matching said outer loop and (ii) a first tuning capacitor and a second tuning capacitor serially deployed within said outer loop with a common node thereof being situated diametrically opposite said junction node and having approximately equal values selected to resonate said outer loop at an operating frequency of said MR system; and
   (b) a center conductor extending between said common node and said junction node, said center conductor having equal capacitive and inductive reactance at the operating frequency and thus being tuned with said outer loop to form a butterfly-type coil therewith for detecting MR signals oriented parallel to the plane of said quadrature coil;
   whereby as a single structure said quadrature coil is enabled to detect both vertical and horizontal components of the MR signals emanating from the region of interest.

2. The quadrature coil of claim 1 further comprising an output line having a first signal conductor, a second signal conductor and a ground conductor, said ground conductor connected to said junction node and said first and said second signal conductors connected across said first and said second drive capacitors, respectively, said first signal, said second signal and said ground conductors (i) each having an electrical length of $S_L+n(\lambda/4)$ wherein $S_L$ is a supplemental length whose reactance is of a same magnitude as a reactance of said drive capacitor corresponding thereto, n is an odd integer, and $\lambda$ is a wavelength of the operating frequency of said MR system; and (ii) terminate in a plug therefor for connecting said quadrature coil to an interface device therefor.

3. An intracavity probe for use with a magnetic resonance (MR) system for obtaining images or spectra of a region of interest within a cavity of a patient, said intracavity probe comprising a quadrature coil including:
   (a) an outer loop for detecting MR signals oriented orthogonal to a plane of said quadrature coil, said outer loop having a plurality of capacitors therein including (i) a first drive capacitor and a second drive capacitor of approximately equal value serially deployed within said outer loop and at a junction node thereof forming a virtual ground for electrically balancing and impedance matching said outer loop and (ii) a first tuning capacitor and a second tuning capacitor serially deployed within said outer loop with a common node thereof being situated diametrically opposite said junction node and having approximately equal values selected to resonate said outer loop at an operating frequency of said MR system;
   (b) a center conductor extending between said common node and said junction node, said center conductor having equal capacitive and inductive reactance at the operating frequency and thus being tuned with said outer loop to form a butterfly-type coil therewith for detecting MR signals oriented parallel to the plane of said quadrature coil;

whereby as a single structure said quadrature coil is enabled to detect both vertical and horizontal components of the MR signals emanating from the region of interest; and (c) a output line having a first signal conductor, a second signal conductor and a ground conductor, said ground conductor connected to said junction node and said first and said second signal conductors connected across said first and said second drive capacitors, respectively, said first signal, said second signal and said ground conductors (i) each having an electrical length of $S_L+n(\lambda/4)$ wherein $S_L$ is a supplemental length whose reactance is of a same magnitude as a reactance of said drive capacitor corresponding thereto, n is an odd integer, and $\lambda$ is a wavelength of the operating frequency of said MR system; and (ii) terminate in a plug therefor for connecting said quadrature coil to an interface device for said intracavity probe.

4. The intracavity probe of claim 3 wherein said first and said second drive capacitors each have a value of approximately 62 pF and said first and said second tuning capacitors each have a value of approximately 30 pF, each of said values being pegged to at least one of (i) an inductance inherent in said outer loop and said center conductor and (ii) an inductance added to at least one of said outer loop and said center conductor.

5. A quadrature coil for use with a magnetic resonance (MR) system for obtaining images or spectra of a region of interest, said quadrature coil comprising:

(a) a flexible substrate comprising a dielectric material;
(b) a first conductor pattern bonded to one side of said flexible substrate, said first conductor pattern including an outer conductive loop having a generally symmetrical shape and defining a drive gap at one end thereof and a first tuning gap at an other end thereof;
(c) a second conductor pattern bonded to an opposite side of said flexible substrate, said second conductor pattern including (i) a drive conductive segment and (ii) a tuning conductive segment, said drive conductive segment overlapping said drive gap symmetrically and forming with said outer conductive loop opposite thereto and said flexible substrate therebetween a first drive capacitor and a second drive capacitor of approximately equal value with a junction node therebetween; and said tuning conductive segment overlapping said first tuning gap and forming with said outer conductive loop opposite thereto and said flexible substrate therebetween a first tuning capacitor and a second tuning capacitor having approximately equal values with a common node thereof being situated diametrically opposite said junction node; so that said outer conductive loop of said first conductor pattern and said drive and said tuning conductive segments of said second conductor pattern form a simple loop-type coil in which said first and said second drive capacitors form at said junction node thereof a virtual ground for electrically balancing and impedance matching said simple loop-type coil and in which said first and said second tuning capacitors enable said simple loop-type coil to resonate at an operating frequency of said MR system and thus to detect MR signals oriented orthogonal to a plane of said quadrature coil;
(d) said first conductor pattern also including an inner conductive segment deployed between said drive and said first tuning gaps but unconnected to both said outer conductive loop and said drive and said first tuning gaps therein; and
(e) said second conductor pattern also including a center conductive segment extending between said drive conductive segment and said tuning conductive segment and defining a second tuning gap therein, said inner conductive segment overlapping said second tuning gap and forming with said center conductive segment opposite thereto and said flexible substrate therebetween a third tuning capacitor whose reactance equals an inductive reactance of said inner and said center conductive segments at the operating frequency and thus enabling said inner and said center conductive segments to be tuned with said simple loop-type coil to form a butterfly-type coil therewith for detecting MR signals oriented parallel to the plane of said quadrature coil;

whereby as a single structure said quadrature coil is enabled to detect both vertical and horizontal components of the MR signals emanating from the region of interest.

6. The quadrature coil of claim 5 further comprising:
(a) a ground conductor bonded to said one side of said flexible substrate and connected to said junction node; and
(b) a first signal conductor and a second signal conductor bonded to said other side of said flexible substrate and connected across said first and said second drive capacitors, respectively, said first signal, said second signal and said ground conductors (i) each having an electrical length of $S_L+n(\lambda/4)$ wherein $S_L$ is a supplemental length whose reactance is of a same magnitude as a reactance of said drive capacitor corresponding thereto, n is an odd integer, and $\lambda$ is a wavelength of the operating frequency of said MR system; and (ii) terminate in a plug therefor for connecting said quadrature coil to an interface device therefor.

7. An interface device for interfacing a quadrature coil with a magnetic resonance (MR) system having a receive cycle and a transmit cycle of operation, said quadrature coil having first and second ports each of which capable of outputting during said receive cycle voltage signals representative of MR signals of horizontal and vertical orientation originating from a region of interest of a patient such that the voltage signals representative of the MR signals of horizontal orientation output by said first and said second ports are 0 degrees apart and the voltage signals representative of the MR signals of vertical orientation output by said first and said second ports are 180 degrees apart, said interface device comprising:

(a) a first phase shifting network connectable across said first port of said quadrature coil enables a phase of the voltage signals received therefrom to be shifted 90 degrees;
(b) a second phase shifting network connectable across said second port of said quadrature coil enables a phase of the voltage signals received therefrom to be shifted 90 degrees;
(c) a first splitter for dividing the voltage signals phase shifted by said first phase shifting network;
(d) a second splitter for dividing the voltage signals phase shifted by said second phase shifting network;
(e) a zero degree combiner for constructively combining the voltage signals representative of the MR signals of horizontal orientation received from said first splitter and the voltage signals representative of the MR signals of horizontal orientation received from said second splitter and for destructively canceling the voltage signals representative of the MR signals of vertical orientation received from said first splitter with the voltage signals representative of the MR signals of vertical orientation received from said second splitter; and (f) a 180 degree combiner for constructively combining the voltage signals representative of the MR signals of vertical orientation received from said first splitter and the voltage signals representative of the MR signals of vertical orientation received from said second splitter and for destructively canceling the voltage signals representative of the MR signals of horizontal orientation received from said first splitter with the voltage signals representative of the MR signals of horizontal orientation received from said second splitter.

8. The interface device of claim 7 further comprising:

(a) a first preamplifier disposed between said first phase shifting network and said first splitter; and (b) a second preamplifier disposed between said second phase shifting network and said second splitter.

9. The interface device of claim 8 further comprising a 90 degree hybrid coupler for combining the voltage signals representative of the MR signals of horizontal orientation received from said zero degree combiner and the voltage signals representative of the MR signals of vertical orientation received from said 180 degree combiner.

10. The interface device of claim 7 further comprising a 90 degree hybrid coupler for combining the voltage signals representative of the MR signals of horizontal orientation received from said zero degree combiner and the voltage signals representative of the MR signals of vertical orientation received from said 180 degree combiner.

\* \* \* \* \*

UNITED STATES PATENT AND TRADEMARK OFFICE
CERTIFICATE OF CORRECTION

PATENT NO. : 8,581,590 B2
APPLICATION NO. : 13/128361
DATED : November 12, 2013
INVENTOR(S) : Misic et al.

It is certified that error appears in the above-identified patent and that said Letters Patent is hereby corrected as shown below:

IN THE DRAWINGS:
In Fig. 8, Sheet 9 of 12, delete "Preampliers" and insert -- Preamplifiers --, therefor.

IN THE SPECIFICATION:

In Column 1, Line 64, delete "$\omega = \upsilon B_0,$" and insert -- $\omega = \Upsilon B_0,$ --, therefor.

In Column 1, Line 68, delete "$\upsilon$" and insert -- $\Upsilon$ --, therefor.

In Column 11, Line 34, delete "is the" and insert -- $\lambda$ is the --, therefor.

In Column 11, Line 44, delete "$_{SL+}\lambda/4$" and insert -- $SL + \lambda/4$ --, therefor.

Signed and Sealed this
Eleventh Day of March, 2014

Michelle K. Lee
*Deputy Director of the United States Patent and Trademark Office*